United States Patent [19]

Decker

[11] 4,389,660

[45] Jun. 21, 1983

[54] HIGH POWER SOLID STATE SWITCH

[75] Inventor: D. Richard Decker, Thousand Oaks, Calif.

[73] Assignee: Rockwell International Corporation, El Segundo, Calif.

[21] Appl. No.: 174,053

[22]* Filed: Jul. 31, 1980

[51] Int. Cl.³ .................... H01L 29/48; H01L 29/80; H01L 27/02

[52] U.S. Cl. ..................................... 357/22; 357/15; 357/41; 357/51

[58] Field of Search ...................... 357/15, 22, 51, 41; 307/571, 443, 572

[56] References Cited

U.S. PATENT DOCUMENTS

| | | | |
|---|---|---|---|
| 3,325,654 | 6/1967 | Mrazek | 307/571 |
| 3,621,347 | 11/1971 | Van Nielen | 317/235 R |
| 3,649,885 | 3/1972 | Nienhuis | 317/235 |
| 3,825,771 | 7/1974 | Boll | 307/214 |
| 4,048,646 | 9/1977 | Ogawa et al. | 357/22 |
| 4,148,046 | 4/1979 | Hendrickson et al. | 357/23 |
| 4,152,714 | 5/1979 | Hendrickson et al. | 357/23 |
| 4,291,326 | 9/1981 | Higuchi et al. | 357/51 |

Primary Examiner—James W. Davie
Attorney, Agent, or Firm—H. Fredrick Hamann; Craig O. Malin; John J. Deinken

[57] ABSTRACT

Disclosed is an integrated dual gate switch which is fabricated on a semi-insulating GaAs substrate. A metallic input line is deposited on the substrate and coupled to an ion implanted n-type region in the substrate through a first ohmic contact. A metallic output line is spaced from the input line and coupled through a second ohmic contact to the n-type region. A first metallic gate is deposited on the substrate between the input and output lines, while a second metallic gate is deposited between the first gate and the output line. A first capacitive coupling between the input line and the first gate includes a first metallic conductor deposited on the substrate and overlapping portions of the input line and first gate, and a first dielectric layer between the first gate and the first conductor. A similar second capacitive coupling between the output line and the second gate includes a second metallic conductor and a second dielectric layer.

10 Claims, 8 Drawing Figures

HIGH POWER SOLID STATE SWITCH

BACKGROUND OF THE INVENTION

This invention relates to the field of electronic switching devices and, more particularly, to solid state switching devices.

In recent years, electronic systems for a wide variety of applications have increasingly been revised to incorporate integrated circuitry. By thus replacing an assemblage of discrete electronic components with integrated circuits, the systems designer is frequently able to reduce the weight and bulk of a circuit while concurrently achieving an increased level of reliability for the system in which the integrated circuitry is incorporated.

An illustrative area in which such integrated circuitry has been successfully introduced is radar technology. Integrated circuitry has been incorporated in the signal transmitting, receiving, and antenna steering portions of radar systems to great advantage. In the effort to develop monolithic microwave integrated circuits for radar, however, it has become necessary to provide a solid state switching element for switching the radar antenna circuitry between the transmitting and receiving portions of the system. Available devices have proven to be unsuited for this task, which requires a high power handling capability for the transmit mode, coupled with a low loss characteristic for the receive mode.

SUMMARY OF THE INVENTION

It is a general objective of this invention to provide a new and improved integrated dual gate switch.

The switch of this invention, which is fabricated on a semi-insulating substrate, includes a region of one conductivity type in the substrate. An input line, and an output line spaced from the input line, are each disposed on the substrate and coupled to the region. A first gate is disposed on the substrate between the input line and the output line, while a second gate is disposed on the substrate between the first gate and the output line. A first capacitive coupling is provided between the input line and the first gate, while a second capacitive coupling extends between the output line and the second gate. Ohmic contacts may be provided for coupling the input and output lines to the region.

In a more particular embodiment, the first capacitive coupling includes a first conductor on the substrate and overlapping a portion of the input line and a portion of the first gate, and a first dielectric layer between the first gate and the first conductor. The second capacitive coupling similarly includes a second conductor disposed on the substrate and overlapping a portion of the output line and a portion of the second gate, with a second dielectric layer between the second gate and the second conductor.

In another more particular embodiment, the dual gate switch is fabricated on a semi-insulating GaAs substrate, and includes an n-type region ion implanted in the substrate, with a metallic input line depositioned on the substrate and coupled to the region. A metallic output line is deposited on the substrate spaced from the input line and coupled to the region. A first metallic gate is deposited on the substrate between the input line and the output line. A second metallic gate is deposited on the substrate between the first gate and the output line. A first capacitive coupling is provided between the input line and the first gate, and includes a first metallic conductor deposited on the substrate and overlapping a portion of the input line and a portion of the first gate, and a first dielectric layer between the first gate and the first conductor. A second capacitive coupling between the output line and the second gate includes a second metallic conductor deposited on the substrate and overlapping a portion of the input line and a portion of the first gate, and a second dielectric layer between the second gate and the second conductor.

A method of making an integrated dual gate switch is also contemplated by the present invention and includes the steps of:

(a) providing a semi-insulating substrate, (b) forming a region of one conductivity type in the substrate, (c) depositing an input line on the substrate so that the input line couples to the region, (d) depositing an output line on the substrate and spaced from the input line so that the output line couples to the region, (e) depositing a first gate on the substrate between the input line and the output line, (f) depositing a second gate on the substrate and extending between the first gate and the output line, (g) forming a first capacitive coupling between the input line and the first gate, and (h) forming a second capacitive coupling between the output line and the second gate.

These examples summarize some of the more important features of this invention in order to facilitate an understanding of the detailed description which follows and so that the contributions which this invention provides to the art may be better appreciated. There are, of course, additional features of the invention, which will be further described below and which are included within the subject matter of the appended claims.

BRIEF DESCRIPTION OF THE DRAWINGS

An understanding of additional objectives, features, and advantages of the present invention may be obtained by reference to the description of the preferred embodiment in conjunction with the accompanying drawings, wherein the same numerals are used to refer to like elements throughout all the figures. In the drawings.

DESCRIPTION OF THE PREFERRED EMBODIMENT

Figure 1:
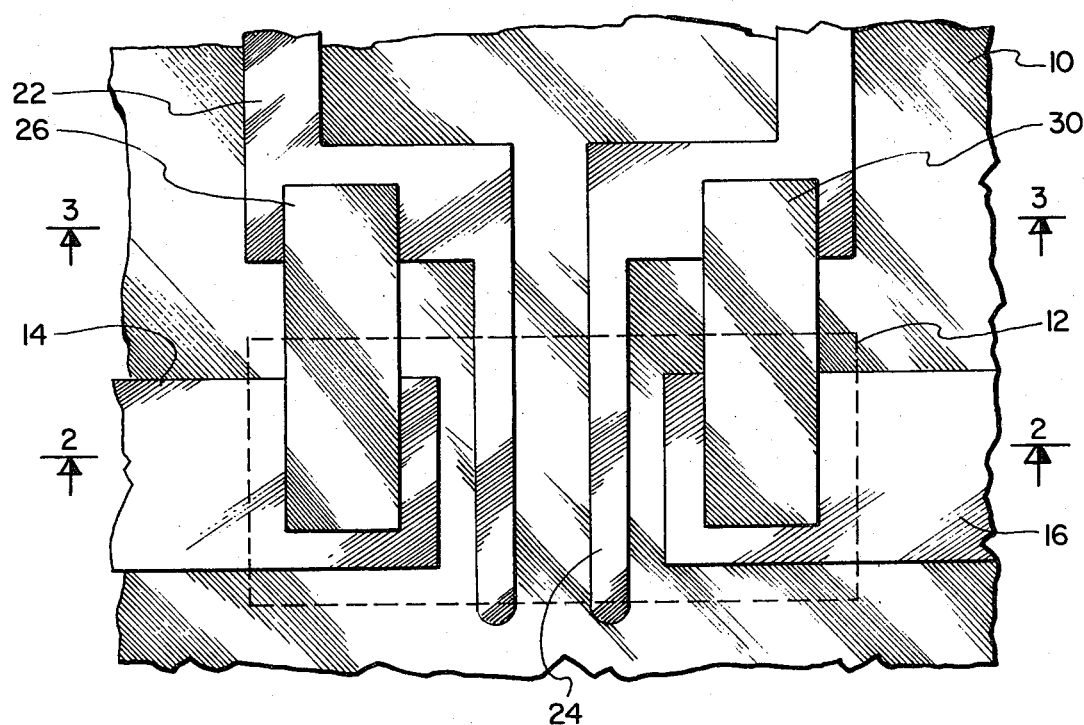
FIG. 1 is a plan view showing an integrated dual gate switch constructed according to the present invention.
Figure 2:
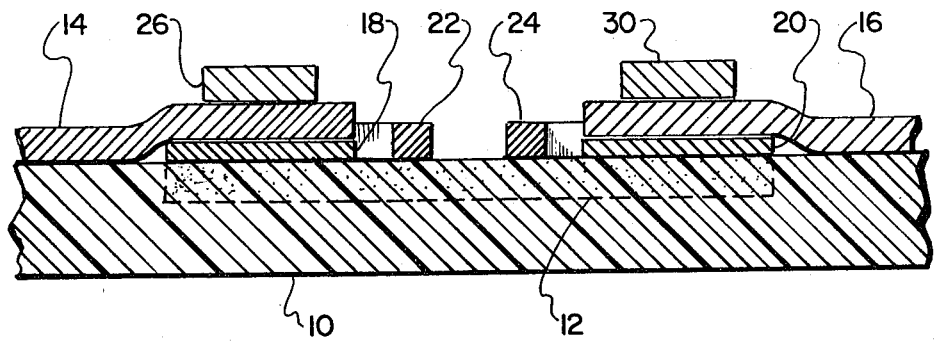
FIG. 2 is a sectional side view showing the switch of FIG. 1 along the line 2—2.
Figure 3:
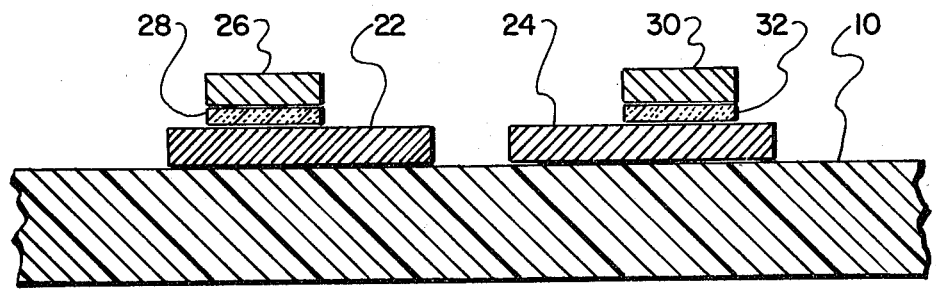
FIG. 3 is a sectional side view showing the switch of FIG. 1 along the line 3—3.

The present invention is concerned with providing a high-power, low-loss switching element for use in integrated circuit applications. Shown in FIG. 1 is a plan view of a particular embodiment of the invention which was developed for incorporation in the circuitry of a GaAs monolithic microwave integrated phased array radar. FIGS. 2 and 3 are sectional views along the lines 2—2 and 3—3 of FIG. 1. As will be appreciated by those skilled in the art, the relative dimensions in the drawings are not proportional to those of an actual device, in order to facilitate the illustration of the inventive principles here involved.

In this embodiment, the switch is fabricated on a semi-insulating GaAs substrate 10, the relevant portion of which is illustrated in the drawings. An n-type region 12, the boundary of which is indicated by a dashed line, is ion implanted in the substrate, with metallic input and output lines 14 and 16, respectively, deposited on the substrate 10 such that these lines are coupled to the n-type region 12 by first and second ohmic contacts 18 and 20.

One outstanding feature of this invention provides dual gate control of the switching element. Thus a first metallic gate 22 is deposited on the substrate 10 between the input line 14 and the output line 16, while a second metallic gate 24 is deposited on the substrate between the first gate 22 and the output line 16. Each of the gates 22 and 24 establishes a Schottky barrier contact with the region 12.

It is another outstanding feature of this invention to provide an integrated switch with capacitive coupling between the input line and the first gate, and between the output line and the second gate. In the embodiment illustrated, this coupling is provided by a first metallic conductor 26, which is deposited on the substrate 10 so that the conductor overlaps portions of both the input line 14 and the first gate 22. A first dielectric layer 28 separates the first conductor from the first gate, while a low resistance electrical contact is formed between the input line and the first conductor. Capacitive coupling is provided in a like manner, between the output line 16 and the second gate 24, by means of a second metallic conductor 30 and a second dielectric layer 32.

Figure 4:
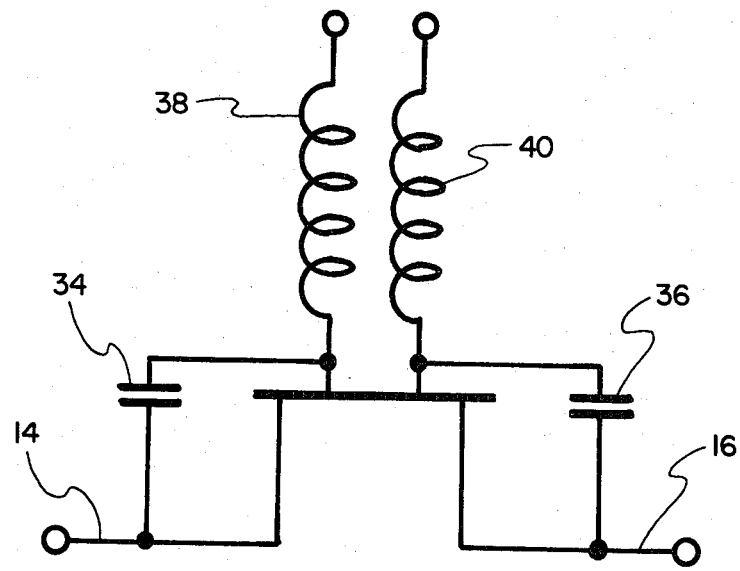
FIG. 4 is a schematic diagram depicting the equivalent electronic circuit for the switch shown in FIGS. 1-3, and FIGS. 5-8 are perspective views illustrating the steps involved in fabricating the switch of FIG. 1 according to the present invention.

FIG. 4 is a schematic diagram showing the equivalent electrical circuit for the field effect transistor switch illustrated in FIGS. 1-3, with capacitors 34 and 36 representing, respectively, the capacitive coupling between the input line and the first gate, and between the output line and the second gate. Inductances 38 and 40 represent the bias inductances in the first and second gate drive lines.

The dual gate configuration of the invention, with a gate on the input line and a gate on the output line, is utilized to provide more effective switching control in the presence of high power levels. This arrangement is incorporated to prevent the possibility of FET turn on as a result of a large signal level across the switch. To maintain the switch in the on state, both gates are biased at 0 Volts or slightly forward biased with respect to the input and output lines, which remain at the same potential. An advantageous feature of this configuration is that no sustaining power is required to keep the switch in the on state.

To effect the off state of the switch, each gate is reverse biased beyond the pinchoff voltage with respect to the input and output lines. Any RF voltage appearing across the open switch will then be coupled to the gates by the capacitors 34 and 36, so that each gate will follow the RF voltage swing and maintain the switch in the off state. Thus, the RF voltage drop occurs between the two gates rather than between one of the gates and either the input or output line, as would be the case for a single gate switch.

The switch of this invention can thus withstand a substantial level of RF voltage without exhibiting degradation of the off state. With an appropriate doping concentration in the region 12 and the proper gate-to-gate spacing, for example, the switch should be capable of accommodating a peak voltage of 20-30 Volts, which corresponds to 9 Watts of power when fed into a transmission line with an impedance of 50 ohms.

In the switch design of the present invention, it is expected that there will be some tradeoff in a particular embodiment between the power handling capacity and the resistance of the switch in the on state. Empirical calculations, however, as will be appreciated by those skilled in the art, can readily be employed to optimize the design according to the desired parameters for a specific application. Design optimization begins with the fact that in both single and dual gate switch designs, current handling capability in the on condition is determined by the drain saturation current. In the off state, these switches demonstrate the I-V characteristics of an open circuit, so that the off impedance is equivalent to the capacitive reactance across the gap in the line. In some situations, such as low power switching applications, a single gate FET switch may be preferred over the dual configuration of the invention, since a switch of the single gate design can be implemented with a somewhat lower on resistance. The dual gate switch, however, will exhibit a lower shunt capacitance in the off state as compared to a single gate FET, thereby offsetting to some extent the slightly higher on resistance of this design.

Figure 5:
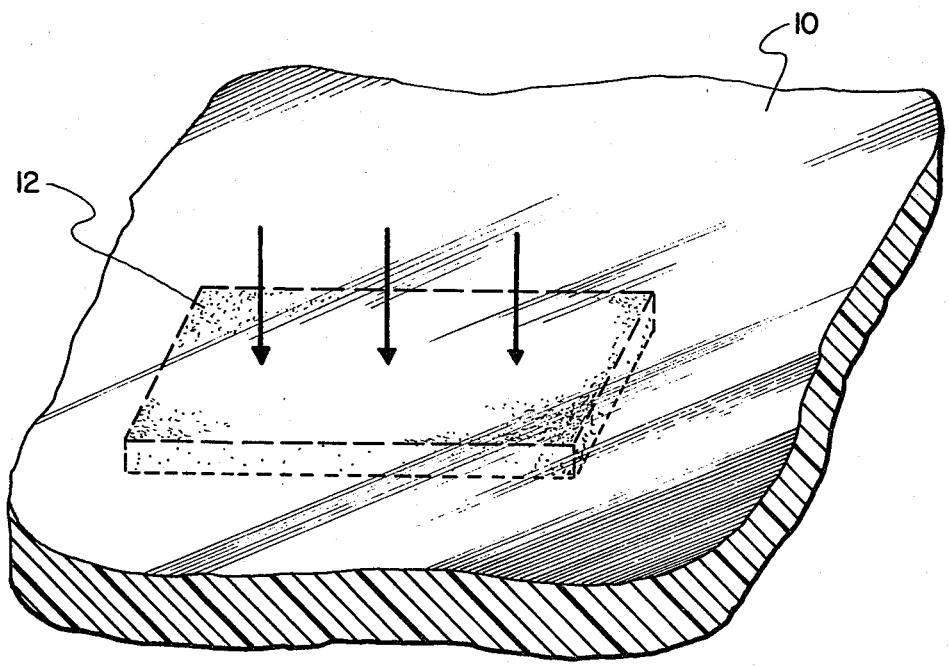

FIGS. 5-8 illustrate, in a perspective view, the sequence of steps involved in making the integrated dual gate switch of the present invention in the preferred embodiment described above. The process begins with a semi-insulating GaAs substrate 10, which is selectively ion implanted to form an n-type region 12, as shown in FIG. 5 by the dashed line.

Figure 6:
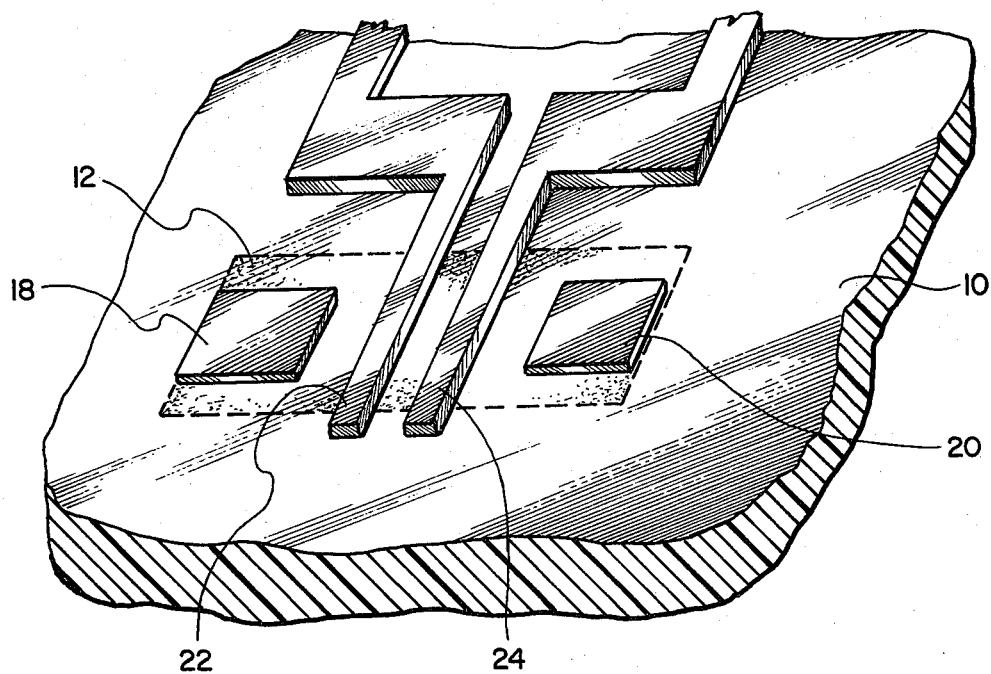
Figure 7:
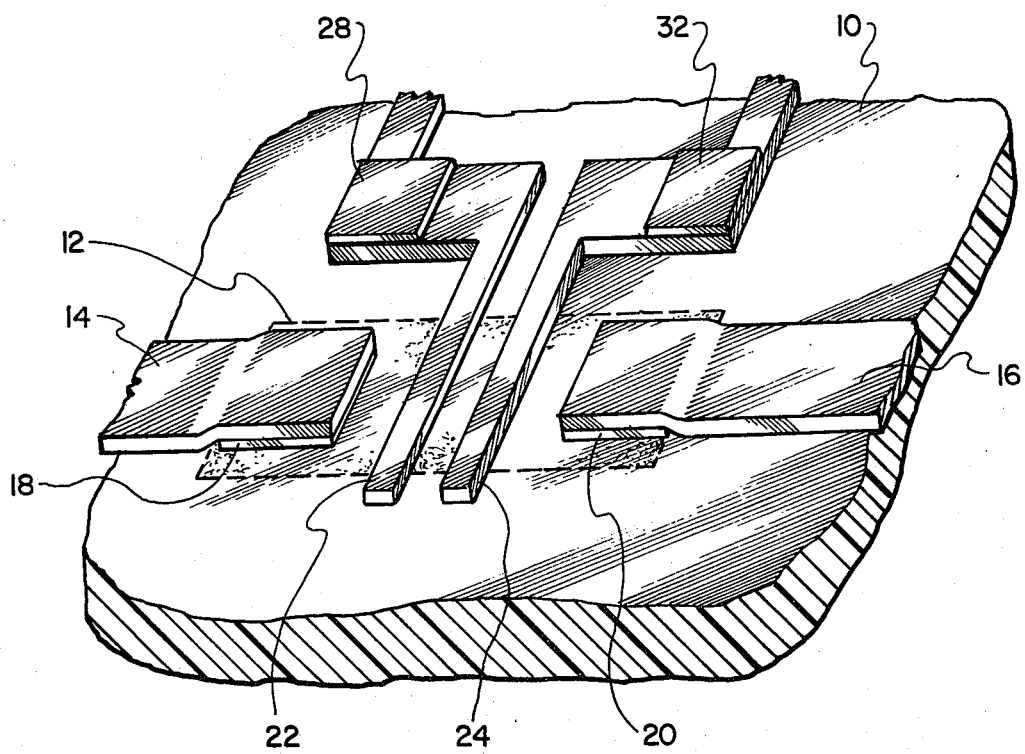

Next, as in FIG. 6, first and second ohmic contacts 18 and 20 are deposited on the n-type region 12. First and second metallic gates 22 and 24 are then deposited on the substrate, forming a Schottky barrier between the n-type region and each gate, so that the gates extend between the input and output lines. Metallic input and output lines 14 and 16 are deposited on the substrate so that each line couples to the n-type region 12 through an ohmic contact, as shown in FIG. 7. Dielectric layers 28 and 32 are deposited on the gates.

Figure 8:
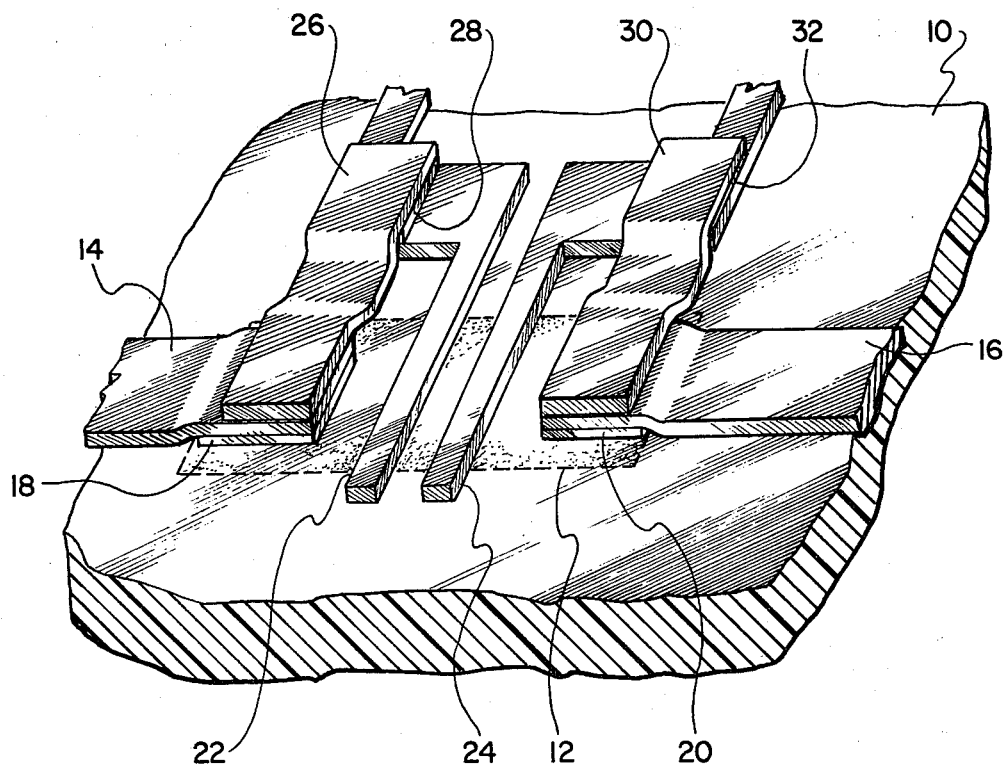

The switch is completed, as shown in FIG. 8, with metallic conductors 26 and 30, which are deposited on the substrate 10 such that the conductors overlap the respective input and output lines and dielectric layers, thereby forming capactive couplings between the gates and the input and output lines.

In conclusion, although a typical embodiment of the present invention has been illustrated and discussed above, numerous modifications and alternative embodiments of the apparatus and method of this invention will be apparent to those who are skilled in the art and receive the teaching of this description. The invention may be of considerable utility, for example, in many solid state switching applications other than the particular one discussed here. Accordingly, this description is to be considered as illustrative only and is provided for the purpose of teaching those skilled in the art the manner of constructing the apparatus and performing the method of this invention. Furthermore, it should be understood that the forms of the invention depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art from the above description of the invention.

What is claimed is:

1. An integrated dual gate switch fabricated on a semi-insulating substrate, comprising:
    a region of one conductivity type in said substrate;
    an input line on said substrate and coupled to said region by a first ohmic contact;
    an output line on said substrate spaced from said input line and coupled to said region by a second ohmic contact;
    a first gate on said substrate between said input line and said output line;
    a second gate on said substrate between said first gate and said output line, said first and second gates being biassed in the on state of said switch at no less than 0 Volts with respect to said input and output lines;
    a first capacitive coupling between said input line and said first gate, including:
        a first conductor on said substrate and overlapping a portion of said input line and a portion of said first gate; and
        a first dielectric layer between said first gate and said first conductor; and
    a second capacitive coupling between said output line and said second gate, including:
        a second conductor on said substrate and overlapping a portion of said output line and a portion of said second gate; and
        a second dielectric layer between said second gate and said second conductor,
    whereby any AC voltage appearing across said switch in the off state will be coupled to said first and second gates by said first and second capacitive couplings to maintain said switch in the off state.

2. The switch of claim 1, wherein said semi-insulating substrate comprises semi-insulating GaAs.

3. The switch of claim 2, wherein said region is of n-type conductivity.

4. The switch of claim 3, wherein said region further comprises a layer in said substrate which is ion implanted with an n-type dopant.

5. The switch of claim 1, wherein each of said input and output lines further comprises a metallic line deposited on said substrate.

6. The switch of claim 5, wherein said gates each further comprise a metallic layer deposited on said substrate to establish a Schottky barrier between each gate and said substrate.

7. An integrated dual gate switch fabricated on a semi-insulating substrate, comprising:
    a region of one conductivity type in said substrate;
    an input line on said substrate and coupled to said region;
    an output line on said substrate spaced from said input line and coupled to said region;
    a first gate on said substrate between said input line and said output line;
    a second gate on said substrate between said first gate and said output line, said first and second gates being biassed in the on state of said switch at no less than 0 Volts with respect to said input and output lines;
    a first capacitive coupling between said input line and said first gate, including:
        a first conductor on said substrate and overlapping a portion of said input line and a portion of said first gate, and
        a first dielectric layer between said first gate and said first conductor; and
    a second capacitive coupling between said output line and said second gate, including:
        a second conductor on said substrate and overlapping a portion of said output line and a portion of said second gate, and
        a second dielectric layer between said second gate and said second conductor,
    whereby any AC voltage appearing across said switch in the off state will be coupled to said first and second gates by said first and second capacitive couplings to maintain said switch in the off state.

8. The switch of claim 7, where each of said input and output lines further comprises a metallic line deposited on said substrate.

9. The switch of claim 8, wherein each of said gates comprises a metallic layer deposited on said substrate to establish a Schottky barrier between each of said gates and said substrate.

10. An integrated dual gate switch fabricated on a semi-insulating GaAs substrate, comprising:
    an n-type region ion implanted in said substrate;
    a metallic input line deposited on said substrate and coupled to said region by a first ohmic contact;
    a metallic output line deposited on said substrate, spaced from said input line, and coupled to said region by a second ohmic contact;
    a first metallic gate deposited on said substrate between said input line and said output line;
    a second metallic gate deposited on said substrate between said first gate and said output line, said first and second gates being biassed in the on state of said switch at no less than 0 Volts with respect to said input and output lines;
    a first capacitive coupling between said input line and said first gate, including:
        a first metallic conductor deposited on said substrate and overlapping a portion of said input line and a portion of said first gate, and
        a first dielectric layer between said first gate and said first conductor; and
    a second capacitive coupling between said output line and said second gate, including:
        a second metallic conductor deposited on said substrate and overlapping a portion of said input line and a portion of said second gate, and
        a second dielectric layer between said second gate and said second conductor,
    whereby any AC voltage appearing across said switch in the off state will be coupled to said first and second gates by said first and second capacitive couplings to maintain said switch in the off state.

* * * * *